(12) United States Patent
Chidambaram

(10) Patent No.: US 7,569,499 B2
(45) Date of Patent: Aug. 4, 2009

(54) SEMICONDUCTOR DEVICE MADE BY MULTIPLE ANNEAL OF STRESS INDUCING LAYER

(75) Inventor: Periannan Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 415 days.

(21) Appl. No.: 11/390,698

(22) Filed: Mar. 28, 2006

(65) Prior Publication Data

US 2007/0232079 A1 Oct. 4, 2007

(51) Int. Cl.
*H01L 21/31* (2006.01)
(52) U.S. Cl. ............... 438/781; 438/938; 257/E21.241
(58) Field of Classification Search .......... 438/308, 438/781, 938; 257/E21.241, E21.497
See application file for complete search history.

(56) References Cited

U.S. PATENT DOCUMENTS

| | | | |
|---|---|---|---|
| 5,997,634 A | 12/1999 | Sandhu et al. | |
| 6,544,854 B1 * | 4/2003 | Puchner et al. | 438/308 |
| 6,774,015 B1 | 8/2004 | Cohen et al. | |
| 6,797,556 B2 | 9/2004 | Murthy et al. | |
| 6,858,506 B2 | 2/2005 | Chang | |
| 6,916,694 B2 | 7/2005 | Hanafi et al. | |
| 7,101,742 B2 | 9/2006 | Ko et al. | |
| 2004/0217393 A1 * | 11/2004 | Takizawa | 257/288 |

OTHER PUBLICATIONS

"Stress Memorization Technique (SMT) by Selectively Strained Nitride Capping for Sub-65 nm High-Performance Strained-Si Device Application," Symp. VLSI Technol. (C.-H. Chen, et al.), p. 56 (2004).

* cited by examiner

*Primary Examiner*—Chandra Chaudhari
(74) *Attorney, Agent, or Firm*—Warren L. Franz; Wade J. Brady, III; Frederick J. Telecky, Jr.

(57) ABSTRACT

The invention provides a method of fabricating a semiconductor device. In one aspect, the method comprises forming a stress inducing layer over a semiconductor substrate, subjecting the stress inducing layer to a first temperature anneal, and subjecting the semiconductor substrate to a second temperature anneal subsequent to the first temperature anneal, wherein the second temperature anneal is higher than the first temperature anneal.

16 Claims, 4 Drawing Sheets

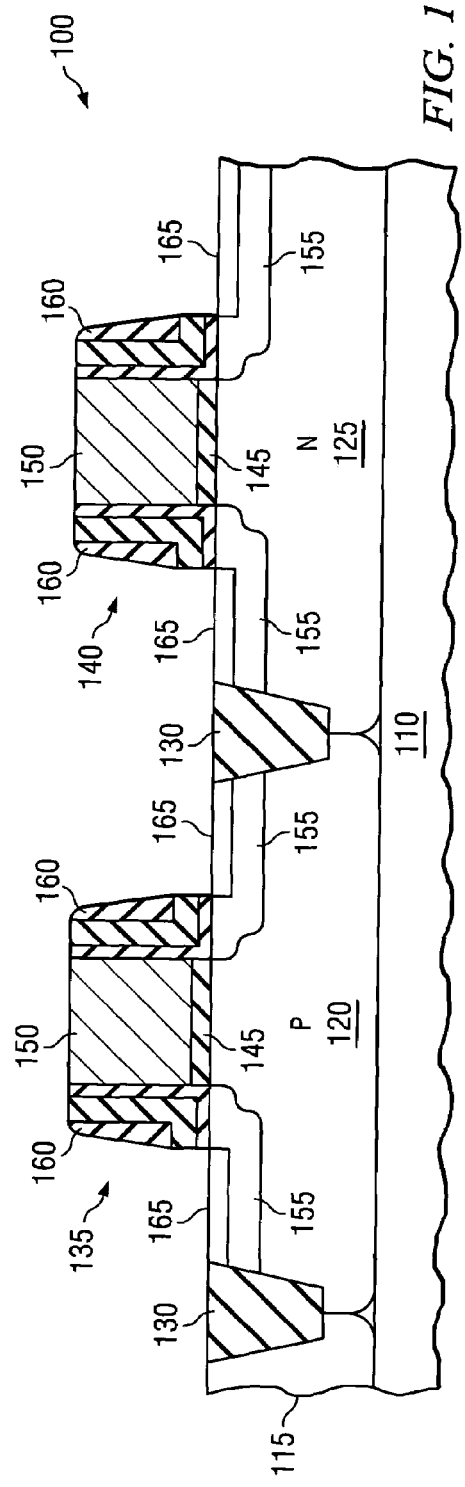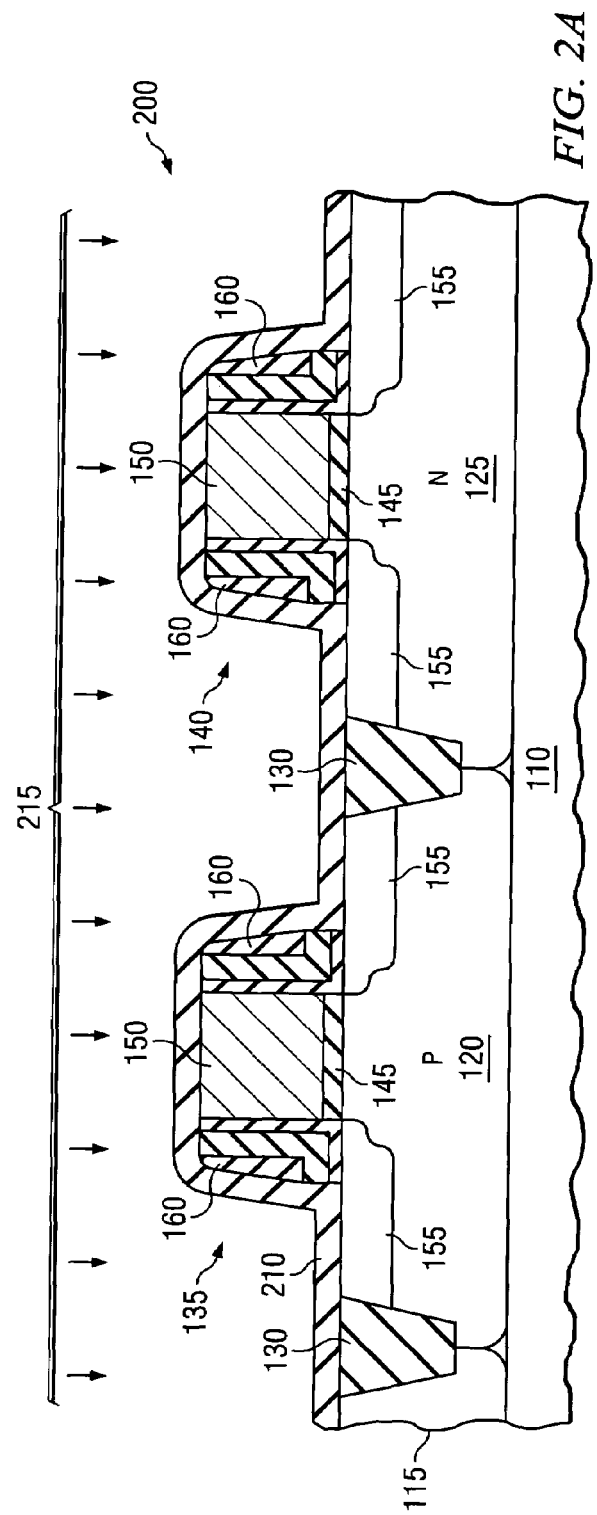
FIG. 1
FIG. 2A

SEMICONDUCTOR DEVICE MADE BY MULTIPLE ANNEAL OF STRESS INDUCING LAYER

TECHNICAL FIELD OF THE INVENTION

The invention is directed in general to a semiconductor device, and more specifically, to a semiconductor device fabricated using a multiple anneal method to anneal a stress inducing layer and reduce dislocations within a semiconductor substrate.

BACKGROUND

There exists a continuing need to improve semiconductor device performance and to further scale semiconductor devices. A characteristic that limits scalability and device performance is electron and hole mobility, also referred to as channel mobility, throughout the channel region of transistors. As devices continue to shrink in size, the transistor channel regions also shrink in size. This can limit channel mobility.

One technique that may improve downward scaling limits and device performance is to introduce strain into the channel region, which can improve electron and hole mobility. Different types of strain, including expansive strain, uniaxial tensile strain, and compressive strain, have been introduced into channel regions in order to determine their effect on electron and/or hole mobility.

The introduction of the stress can be accomplished by first placing a stress inducing layer, such as a nitride or oxide layer, over completed gate structures. The device is then subjected to an anneal process at temperatures that exceed 1000° C. This not only incorporates stress into the channel region of the transistors, but it is also sufficient to activate the dopants located within source/drains.

It has been realized, however, that this temperature stress inducing process also creates dislocations within the channel region of the semiconductor substrate. Dislocations occur when crystallographic planes within the substrate shift slightly and create a path along which mid-level states and dopant segregation can occur. These mid-level states and this dopant segregation can create a conductive path between the source and drain, which causes a short that renders the transistor inoperative.

Some stress inducing processes have been developed by the semiconductor industry to combat this problem, but these processes typically involve multiple and complex processing steps that are both costly and time-consuming.

Accordingly, what is needed is a semiconductor device and method of manufacturing that device that provides the required amount of stress but reduces the formation of dislocations between the source/drain.

SUMMARY OF INVENTION

The invention, in one embodiment, provides a method of fabricating a semiconductor device. This embodiment comprises forming a stress inducing layer over a semiconductor substrate and subjecting the stress inducing layer to multiple anneals to reduce the formation of dislocations within a channel region of the semiconductor device. The step of subjecting comprises annealing with a first temperature and then a second temperature, where the second temperature is greater than the first temperature.

In another embodiment, the method comprises a method of forming a semiconductor device, comprising incorporating a stress into a channel region of a semiconductor device at a first temperature, and subjecting the semiconductor device to a second temperature subsequent to incorporating the stress.

BRIEF DESCRIPTION OF THE DRAWINGS

The invention is described with reference to example embodiments and to accompanying drawings, wherein:

FIG. 1 illustrates a sectional view of one embodiment of a semiconductor device provided by the invention;

FIGS. 2A-2C illustrate alternative embodiments of manufacturing the semiconductor device.

DETAILED DESCRIPTION

Figure 2B:
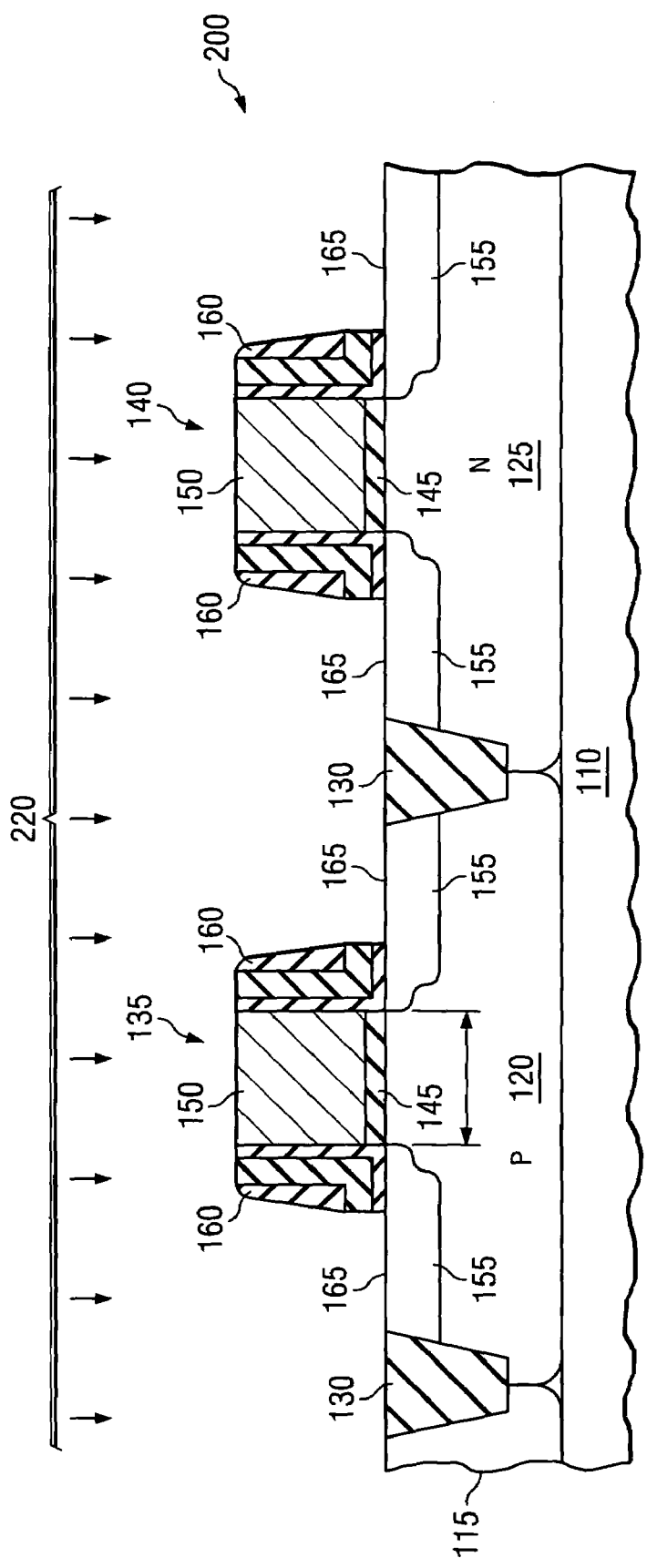

FIG. 1 illustrates one embodiment of a semiconductor device 100 of the invention. The semiconductor device 100 may comprise a semiconductor substrate 110, such as silicon, silicon-germanium, or gallium arsenide. Also, the semiconductor substrate 110 may include bulk silicon as well as silicon-on-insulator. Located over the substrate 110 is an active region 115. The active region 115 may be a portion of the substrate 110 that is doped to function as an active region, or it may be a doped epitaxial layer. Wells 120 and 125 are located in the active region 115. The wells may be doped with the same type of dopant, or they may be complementary doped wells, as indicated. Isolation structures 130, such as shallow trenches, are also located in the active region 115 and may be filled with a dielectric material, such as a high density oxide. A method of manufacturing the semiconductor device 100 is discussed below.

The semiconductor device 100 may also include field effect transistors 135, 140. The transistors 135, 140 may be configured as PMOS or NMOS, or they may be arranged in a complementary configuration, as shown. The transistors 135, 140, may comprise components such as gate dielectric layers 145 over which are located gate electrodes 150. In some embodiments, the gate electrodes 150 may be doped polysilicon, silicided polysilicon, metal, or a combination of any of these. The transistors 135, 140 may also each comprise source/drains 155 and spacers 160. The source/drains 155 in some embodiments may include extension regions, such as lightly doped drains (LDDs) that extend under the spacers 160, but in other embodiments, the extension regions may not be present. The spacers 160 may comprise a single layer or multiple layers as shown, such as oxides, nitrides, or combinations thereof. The semiconductor device 100 may also include silicide contacts 165. The space between the source/drains 155 and located under the gate electrodes 150 form a channel region that in the invention has reduced dislocations. Various embodiments by which this can be achieved are discussed below.

FIG. 2A shows an embodiment of a semiconductor device 200 of the invention at one stage of manufacture. In this embodiment, the semiconductor device 200 includes the same features as discussed above with the exception that the silicide contacts have not yet been formed. One embodiment provides that conventional processes and materials can be used to construct the semiconductor device 200 to the point shown in FIG. 2A.

Also shown in FIG. 2A is a stress inducing layer 210 that is located over the gates 150. The stress inducing layer 210 may be comprised conventional materials, such as silicon nitride, oxide or silicon germanium. In other embodiments, however, the layer may not necessarily be located over the gates 150 but may be located adjacent the gates 150. Conventional processes may also be used to deposit the stress inducing layer 210. The stress inducing layer 210 imparts a stress, as indicated by the arrows, into the channel region between the source/drains 155. The stress is added to improve the performance of the channel region and improve electron and hole mobility. Further, the type of stress that is imparted, whether it is compressive or tensile, will depend on the type of film used and the anneal conditions. Typically, a compressive stress may be imparted to a PMOS device, while a tensile stress may be imparted to an NMOS device. These may be imparted using separate films and processes to achieve the different types of stress, depending on the doping configuration of the semiconductor device 200. However, the principles of the invention may be used on either type of device to obtain the stress desired.

FIG. 2A illustrates one embodiment of the invention wherein the layer 210 is subjected to a first temperature anneal 215. In one embodiment, the first temperature anneal is conducted at temperatures that are less than about 1000° C. In other embodiments, the first temperature may range from about ($\pm$10 to 20° C.) 1000° C. to about 500° C., and in a more specific embodiment, the temperature may be about 500° C. or lower.

The invention provides a method of reducing the number of dislocations that occur by dividing the stress inducing process into at least two or more annealing steps and allowing for greater control over how the stress is incorporated into the channel region. As a result, the number of dislocations in the channel region is reduced, which can aid in reducing the number of shorts, and thereby increase the reliability of the semiconductor device 200, while retaining the added benefits associated with the stress incorporation. From this point, the semiconductor device 200 may be completed using well-known conventional processes and materials.

The invention is an improvement over conventional processes wherein the stress inducing process is typically completed in one anneal step and is not divided into at least two or more (i.e., multiple) steps. In such conventional processes, the stress inducing process is less controlled in that multiple steps are not used, and the single anneal step is typically conducted at a temperature higher than 1000° C. to impart the stress into the channel region. However, this one step, high temperature anneal results in a greater number of dislocations within the channel region as compared to a semiconductor device made in accordance with the invention.

FIG. 2B illustrates one embodiment of the invention where the stress inducing layer 210 is removed following the first temperature anneal 215. The semiconductor device 200 is subjected to a second temperature anneal 220 that will be higher than the first temperature anneal 215. The second temperature anneal 220 is conducted prior to the deposition of an interlevel or pre-metal dielectric layer, which is a layer in which or on which contacts and interconnects are located. The temperatures of the second temperature anneal 220 may vary but will be about 1000° C. or greater to slightly less than the melting points of either the substrate 110 or active layer 115, whichever is less. The second temperature anneal 220 may be used to activate the source/drains 155, as well. This is in contrast to conventional processes where the source/drains are usually activated at the same time that the stress is incorporated into the channel region. In this embodiment, however, the first temperature anneal 215 that is used to incorporate the stress is not sufficient to activate the source/drains 155, thus the second temperature anneal 220 is used to accomplish the source/drain activation.

Figure 2C:
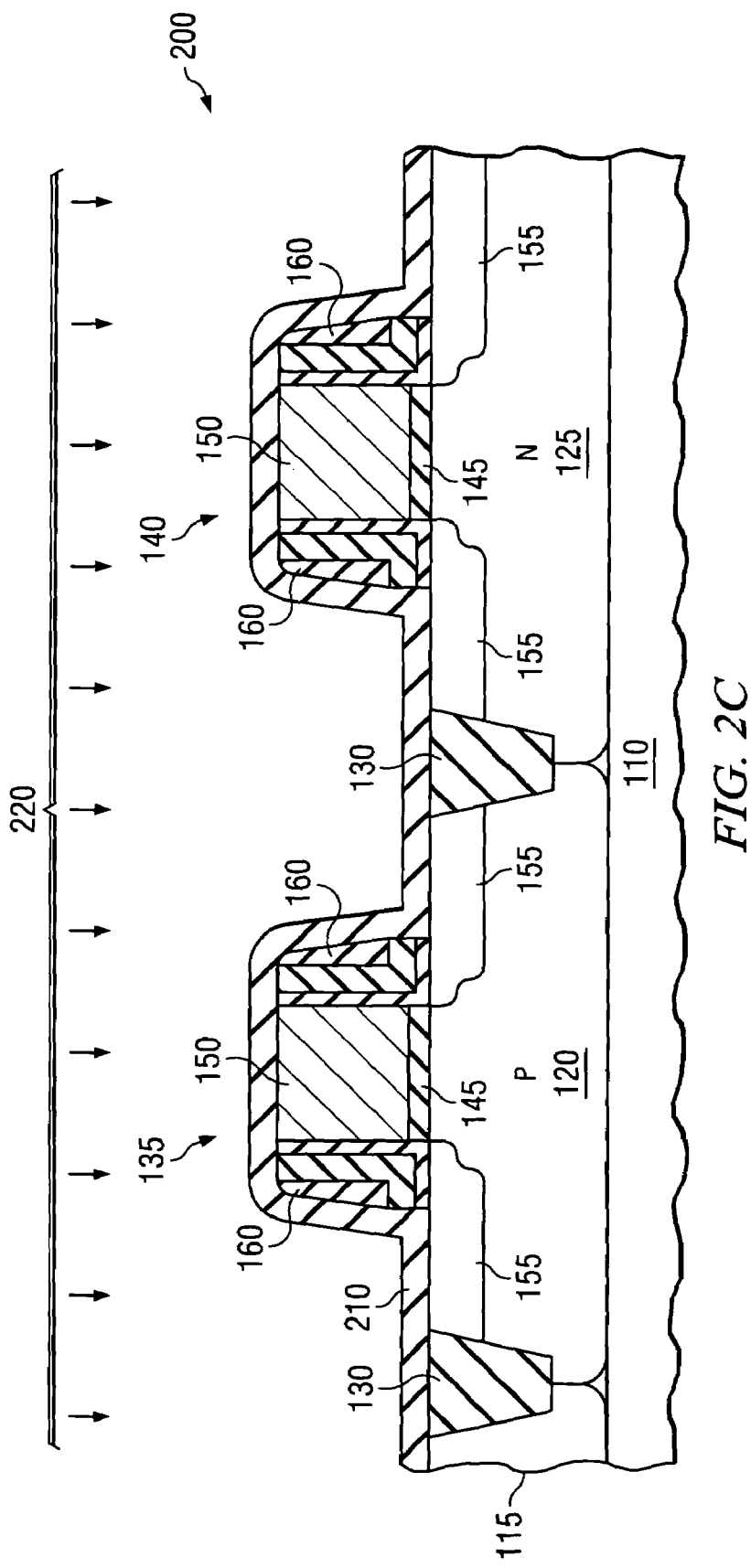

FIG. 2C illustrates another embodiment of the semiconductor device 200 wherein the stress inducing layer 210 is not removed following the first temperature anneal 215, but is, instead, left in place during the second temperature anneal 220. Even though the layer 210 is left in place during the anneal 220, dislocation formation is still reduced because defect propagation requires both nucleation and growth of the defects. The first temperature anneal 215, it is believed, changes both. It is also believed that when the initial first temperature anneal 215 is used, the nucleation process is changed so the second anneal does not cause as much damage as conventional processes. Thus, the advantages associated with the invention can still be realized without removing the stress inducing layer 210 during the second temperature anneal 220. Following the completion of the second temperature anneal, the layer 210 may be removed, or not, depending on the embodiment. In either case, conventional processes may then be used to complete the fabrication of the semiconductor device 200.

Figure 3:
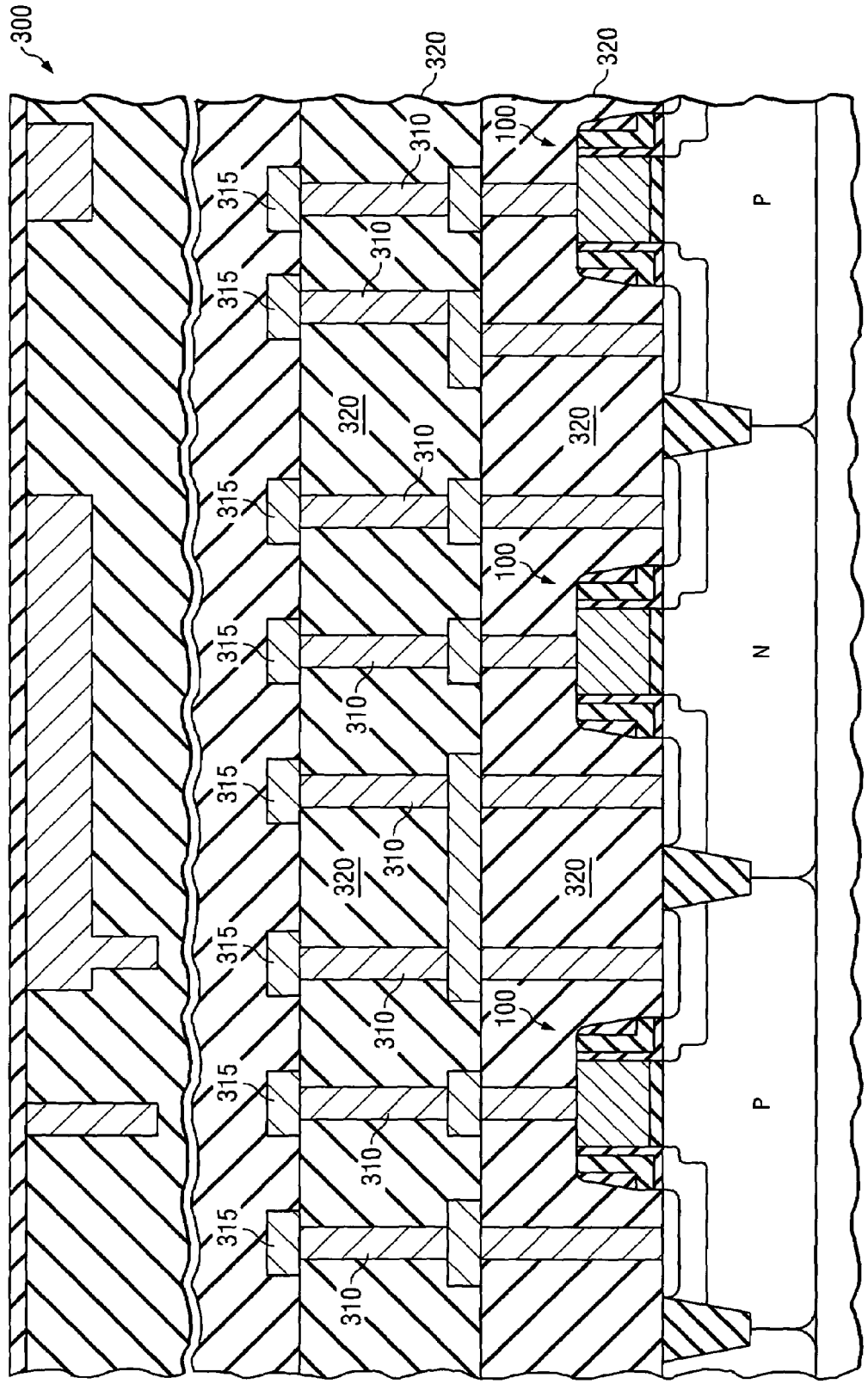
FIG. 3 illustrates a sectional view of the semiconductor device configured as an integrated circuit (IC).

FIG. 3 is a semiconductor device 300 configured as an integrated circuit (IC) that incorporates the semiconductor device 100 of FIG. 1. The device 300 may be configured into a wide variety of devices, as CMOS devices, BiCMOS devices, bipolar devices, or other semiconductor devices, as well as capacitors or other types of devices. The device 300 may further include passive devices, such as inductors or resistors, or it may also include optical devices or optoelectronic devices. Those skilled in the art are familiar with these various types of devices and their manufacture. The semiconductor device 300 includes the various components as discussed above, and conventional interconnect structures 310 and metal lines 315 electrically connect the components of the semiconductor device 100 to form an operative IC. The interconnect structures 310 and metal lines 315 may be formed in conventional dielectric layers 320 that are located over the semiconductor device 100. The number of dielectric layers 320 and metal lines 315 will varying with design.

Those skilled in the art to which the invention relates will appreciate that other and further additions, deletions, substitutions, and modifications may be made to the described example embodiments, without departing from the invention.

What is claimed is:

1. A method of fabricating a field effect transistor having a strained channel, the method comprising:
   providing a doped active well region on a semiconductor substrate;
   providing a gate dielectric layer over the well region;
   providing a gate electrode over the gate dielectric layer;
   providing doped source/drain regions in the active well region, the source/drain regions spaced to form a channel region located under the gate electrode;
   forming a stress inducing layer over the gate electrode;
   performing a first anneal at a temperature and not sufficient to activate the doped source/drain regions; the first anneal serving to transfer stress from the stress inducing layer into the channel region;
   performing a second anneal at a temperature higher than the temperature of the first anneal; the second anneal serving to activate the doped source/drain regions; and
   removing the stress inducing layer.

2. The method of claim 1, wherein the stress inducing layer is removed prior to the second anneal.

3. The method of claim 1, wherein the first anneal is performed at a temperature of less than about 1000° C.; and the second anneal is performed at a temperature of greater than about 1000° C.

4. The method of claim 1, wherein the first anneal is performed at a temperature of about 500° C., or lower.

5. The method of claim 1, further comprising depositing an interlevel dielectric layer after performing the second anneal.

6. The method of claim 1, wherein the gate electrode comprises doped polysilicon; and the stress inducing layer comprises silicon nitride.

7. A method of fabricating a field effect transistor having a strained channel, the method comprising:
   providing a doped active well region on a semiconductor substrate;
   providing a gate dielectric layer over the well region;
   providing a doped polysilicon gate electrode over the gate dielectric layer;
   providing doped source/drain regions in the active well region, the source/drain regions spaced to form a channel region located under the gate electrode;
   forming a silicon nitride stress inducing layer over the gate electrode;
   performing a first anneal at a temperature less than about 1000° C. and not sufficient to activate the doped source/drain regions; the first anneal serving to transfer stress from the stress inducing layer into the channel region;
   performing a second anneal at a temperature greater than about 1000° C.; the second anneal serving to activate the doped source/drain regions; and
   removing the stress inducing layer.

8. The method of claim 3, wherein the first anneal is performed at a temperature of about 500° C., or lower.

9. The method of claim 8, wherein the stress inducing layer is removed prior to the second anneal.

10. The method of claim 6, wherein the stress inducing layer is removed prior to the second anneal.

11. A method of fabricating a field effect transistor having a strained channel, the method comprising:
   providing a gate structure including a doped active well region on a semiconductor substrate; a gate dielectric layer over the well region; a gate electrode over the gate dielectric layer; and doped source/drain regions in the active well region, the source/drain regions spaced to form a channel region located under the gate electrode;
   forming a stress inducing layer over at least a portion of the gate structure;
   performing a first anneal at a temperature and not sufficient to activate the doped source/drain regions; the first anneal serving to transfer stress from the stress inducing layer into the channel region;
   performing a second anneal at a temperature higher than the temperature of the first anneal; the second anneal serving to activate the doped source/drain regions; and
   removing the stress inducing layer.

12. The method of claim 11, wherein the stress inducing layer is removed prior to the second anneal.

13. The method of claim 11, wherein the first anneal is performed at a temperature of less than about 1000° C.; and the second anneal is performed at a temperature of greater than about 1000° C.

14. The method of claim 13, wherein the first anneal is performed at a temperature of about 500° C., or lower.

15. The method of claim 11, further comprising depositing an interlevel dielectric layer after performing the second anneal.

16. The method of claim 11, wherein the gate electrode comprises doped polysilicon; and the stress inducing layer comprises silicon nitride.

* * * * *

UNITED STATES PATENT AND TRADEMARK OFFICE
CERTIFICATE OF CORRECTION

| | | |
|---|---|---|
| PATENT NO. | : 7,569,499 B2 | Page 1 of 1 |
| APPLICATION NO. | : 11/390698 | |
| DATED | : August 4, 2009 | |
| INVENTOR(S) | : Periannan Chidambaram | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 544 days.

Signed and Sealed this

Seventh Day of September, 2010

David J. Kappos
*Director of the United States Patent and Trademark Office*